United States Patent [19]

Jun

[11] Patent Number: 5,409,855
[45] Date of Patent: Apr. 25, 1995

[54] PROCESS FOR FORMING A SEMICONDUCTOR DEVICE HAVING A CAPACITOR

[75] Inventor: Young-Kwon Jun, Songpa-gu, Rep. of Korea

[73] Assignee: Goldstar Electron Co., Ltd., Cheongju-Si, Rep. of Korea

[21] Appl. No.: 960,145

[22] Filed: Oct. 13, 1992

[30] Foreign Application Priority Data

Oct. 10, 1991 [KR] Rep. of Korea .................. 91-17726

[51] Int. Cl.⁶ .................. H01L 21/70; H01L 27/00
[52] U.S. Cl. .................. 437/52; 437/60; 437/919
[58] Field of Search .................. 437/60, 52, 47, 919

[56] References Cited

U.S. PATENT DOCUMENTS 5,155,057 10/1992 Dennison et al. .................. 437/47
5,180,683 1/1993 Wakamiya et al. .................. 437/47

FOREIGN PATENT DOCUMENTS 2-275665 11/1990 Japan .

OTHER PUBLICATIONS

Electrical Characterization of Textured Interpoly Capacitors for Advanced Stacked Drams by: Pierre C. Fazan and Akram Ditali; IEDM 1990, pp. 27.5.1–27.5.4.
Rugged Surface Poly-si Electrode and Low Temperature Deposited Si₃N₄ for 64MBIT and Beyond STC Dram Cell by: M. Yoshimaru, J. Miyar N. Inoue, A. Sakamoto, S. You, H. Tamura and M. Ino; IEDM 1990, pp. 27.4.1–27.4.4.
A capacitor-Over-Bit-Line (COB) Cell with a Hemispherical-Grain Storage Node for 64 Mb DRAMS by: M. Sakao, N. Kasai, T. Ishijima, E. Ikawa, H. Watanabe, K. Terada and T. Kikkawa; IEDM 1990; pp. 27.3.1–27.3.4.

Primary Examiner—Olik Chaudhuri
Assistant Examiner—H. Jey Tsai
Attorney, Agent, or Firm—Alan R. Loudermilk

[57] ABSTRACT

A method for making a semiconductor memory cell having a storage capacitor disposed between metallization layers. Field and active regions and transistor circuit elements are formed on a substrate, on which is formed an insulating layer. A bit line is formed through a contact formed in the insulating layer. Another insulating layer is formed and a contact is formed to a word line and transistor and a primary metallization layer is formed of a refractory metal or metal compound. An oxide and an insulating layer are formed, and a buried contact to a source/drain region of a memory access transistor is formed to have an oxide side wall, and the storage electrode, dielectric and plate electrode are formed thereon. A secondary metallization layer may also be formed.

22 Claims, 5 Drawing Sheets

PROCESS FOR FORMING A SEMICONDUCTOR DEVICE HAVING A CAPACITOR

FIELD OF THE INVENTION

The present invention relates to a semiconductor memory cell and a process for formation thereof, and more particularly to a semiconductor memory cell in which the effective area of a stacked capacitor is increased and the height difference between the memory cell and the surrounding circuit portions is reduced, thereby easing the metallization process for the memory.

BACKGROUND OF THE INVENTION

One of the conventional processes for formation of semiconductor memory cells is the process for formation of "COB" (capacitor over bit line) cells, an example of which is illustrated in FIG. 1. Such a COB cell is disclosed in "IEDM 90-655, 27.3.1 to 27.3.4".

FIGS. 1A, 1B and 1D are sectional views taken along line 1A—1A of FIG. 1F, and FIG. 1C is a sectional view taken along line 1C—1C of FIG. 1F.

Referring to FIG. 1A, rectangular active area 22 (see FIG. 1F) is formed by applying a polysilicon buffered LOCOS process, followed by formation of a gate oxide. Then, word line 3 is formed. After capacitor buried contact hole 51 is opened, local interconnects 5 are formed using polysilicon.

Then, as shown in FIG. 1B, after insulating layer 8 is deposited, a bit line contact is opened and filled with doped polysilicon plug 6. Tungsten polycide bit-line 7 is formed to run above the active areas.

FIG. 1C is a sectional view taken along line 1C—1C of FIG. 1F. As shown in FIG. 1C, insulating inter-layer 81 is formed on the bit line and is planarized.

After opening the capacitor contact, "HSG" (hemispherical grain) polysilicon storage electrode 9 is formed. HSG polysilicon storage node 9 is connected to the active area through the capacitor contact and local interconnect 5.

Then, as shown in FIG. 1D, a capacitor dielectric layer and capacitor plate electrode are formed. After insulating inter-layer 82 is deposited, primary metal wiring 55 is formed.

FIG. 1F illustrates the layout of the memory cell, and FIG. 1E is a perspective view of a part of the memory cell.

In the memory cell formed in the above described manner, the height of storage electrode 9 typically has to be over 4000Å in order to obtain sufficient capacitance for each memory cell, and, therefore, a height difference exists between the memory cell and the surrounding portions before carrying out the primary metal wiring. As a result of the height difference, patterning errors are increased when carrying out subsequent processes (such as photo-lithographic and etch processes).

SUMMARY OF THE INVENTION

The present invention is intended to overcome the above described disadvantages of the conventional techniques.

Accordingly, it is an object of the present invention to provide a semiconductor memory cell and a process for formation thereof in which the effective area of the capacitor is increased by utilizing the height difference of a buried contact, and a storage electrode of the capacitor is formed after carrying out a primary metallization process, thereby reducing the height difference between the memory cell and the surrounding portions, and consequently improving the precision of the metallization.

In achieving the above object, the semiconductor memory cell of the present invention is characterized in that a capacitor consisting of a storage electrode, a dielectric layer and a plate electrode is disposed between a final metallization wiring and a primary metallization wiring lying over a bit line layer.

In achieving the above object, the process for formation of a semiconductor memory cell according to the present invention includes the steps of:

(1) forming a field oxide layer upon a silicon substrate defining an active area and a field region, opening a contact for a bit line, depositing a doped polysilicon layer, forming a polysilicon plug on the contact portion by etching back the doped polysilicon layer, depositing a tungsten polycide layer, and patterning the tungsten polycide layer to form a bit line;

(2) depositing an insulating inter-layer, flattening the insulating inter-layer, opening a contact between a word line and a source/drain region of the active area (to be connected to the primary metallization wiring), depositing a refractory metal compound, and patterning the refractory metal compound to form a primary metallization wiring;

(3) depositing an oxide layer, flattening the oxide layer, and depositing an insulating layer, the insulating layer having a high etch selectivity (i.e., a large etch rate difference from that of the oxide layer);

(4) opening a contact hole for a buried contact to be connected to a storage electrode of the capacitor and to a source/drain region of the active area, depositing an oxide layer, and carrying out an anisotropic dry etching deeper than the thickness of the oxide layer in order to form a side wall of the oxide layer along the side wall of the buried contact hole;

(5) depositing a polysilicon layer, patterning the polysilicon layer to form a storage electrode, removing the high etch selectivity insulating layer by applying a wet etching process, and forming a dielectric layer on the surface of the storage electrode of the capacitor; and (6) depositing and patterning a plate polysilicon, forming an insulating layer thereupon, and carrying out a secondary metallization process.

The present invention is further characterized in that the metallic material used in the primary metallization at step (2) may be a refractory metal or metal compound having a melting point of over 800° C.

The present invention is still further characterized in that: at step (6), a contact hole is opened for connecting the primary metallization wiring to the plate electrode of the capacitor; and then, a polysilicon layer is deposited and patterned to form a plate electrode of the capacitor in such a manner that the primary metallization wiring and the capacitor plate electrode are contacted in a self-aligned manner.

BRIEF DESCRIPTION OF THE DRAWINGS

The above object and other advantages of the present invention will become more apparent by describing in detail the preferred embodiment of the present invention with reference to the attached drawings in which.

DESCRIPTION OF THE PREFERRED EMBODIMENT

The preferred embodiment of the present invention will be described with reference to FIGS. 2A to 9.

Figure 6A:
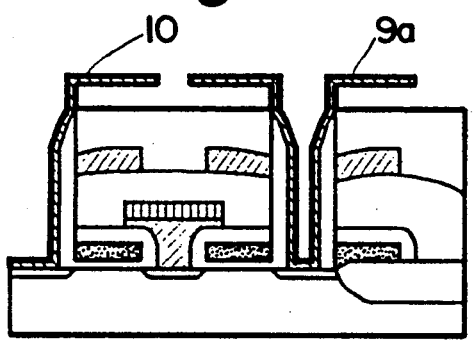
Figure 6B:
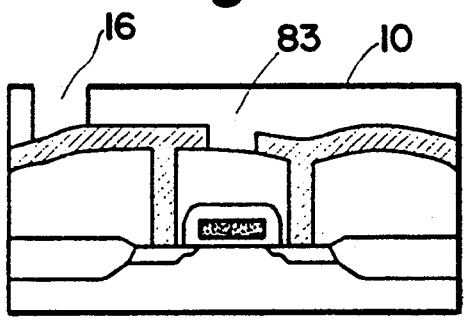
Figure 7A:
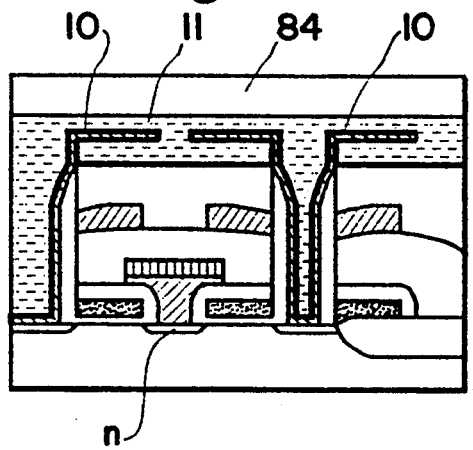
Figure 7B:
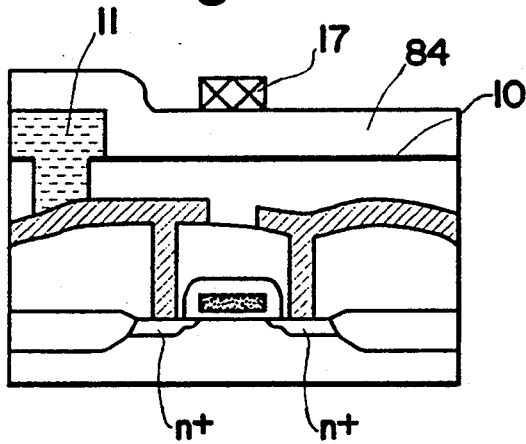
Figure 8:
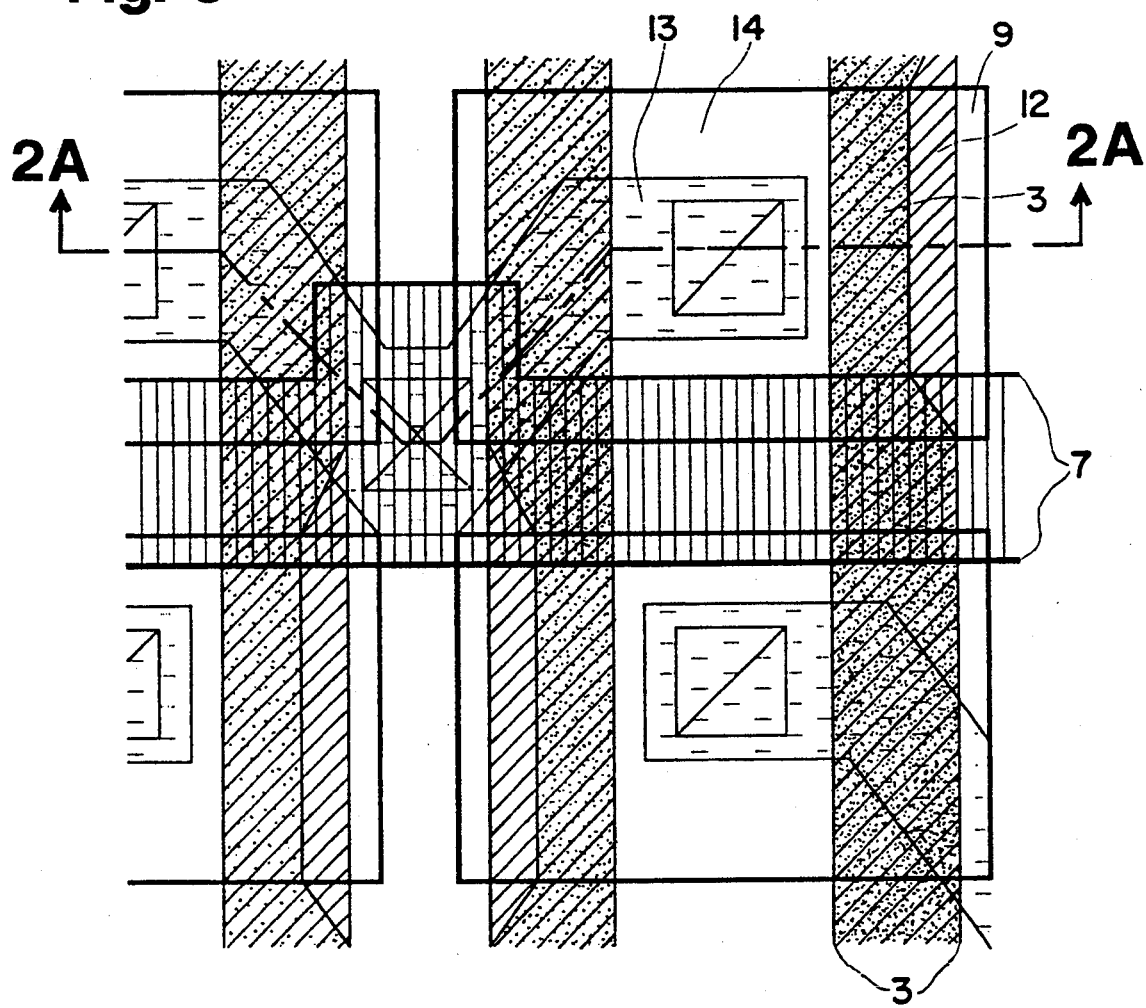

FIG. 8 illustrates the layout of the memory cell according to the present invention, and FIGS. 2A to 7B and FIG. 9 are sectional views illustrating the formation process according to the present invention. The drawings positioned on the left side (i.e., FIG. 2A, 3A, 4A, etc.) are sectional views of the memory cell taken along line 2A—2A of FIG. 8, while the drawings positioned on the right side (i.e., FIG. 2B, 3B, 4B, etc.) are sectional views of a transistor disposed adjacently. A reference herein to FIG. 2, for example, generally is a reference to both FIGS. 2A and 2B, etc.

In FIG. 8, reference numeral 13 indicates a V shaped active area which is surrounded by field region 14. A portion 7 which is hatched with vertical lines indicates a bit line, reference numeral 3 indicates a word line, the rectangular portion 9 indicates a storage electrode of the capacitor, and reference numeral 12 indicates a primary metallization wiring.

The process for formation of the semiconductor memory cell according to the present invention is carried out in the following manner.

As shown in FIG. 2, field oxide layer 2 is formed upon semiconductor substrate 1 in order to isolate an active area and a field region, and word line 3 covered by insulating layer 24 and source/drain regions n, n+ of transistors are formed, then a bit line contact is opened, and then, a doped polysilicon layer is deposited, which is etched back, thereby forming polysilicon plug 6a on the bit line contact portion.

Then, a tungsten polycide layer is deposited and patterned to form bit line 7, and insulating inter-layer 4 is deposited in the form of a BPSG or CVD oxide layer, insulating inter-layer 4 being flattened thereafter.

Figure 1A:
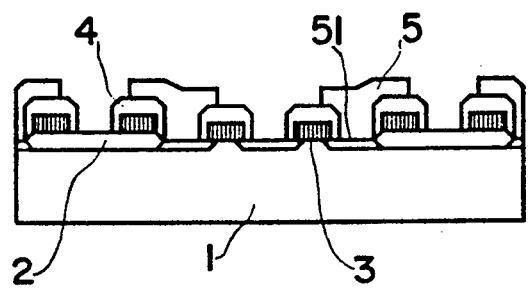
FIGS. 1A to 1F illustrate the process for formation of a conventional memory cell, its structure and its layout.
Figure 1B:
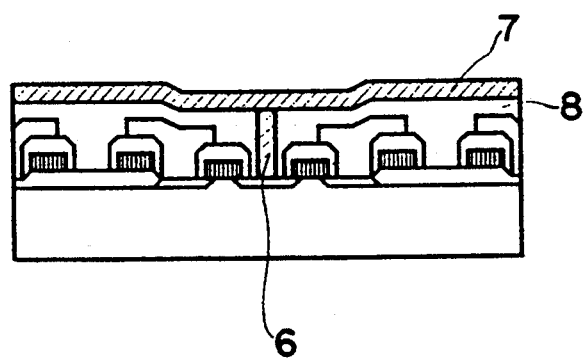
Figure 1C:
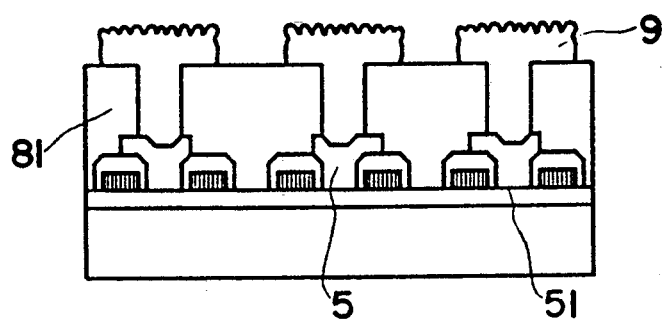
Figure 1D:
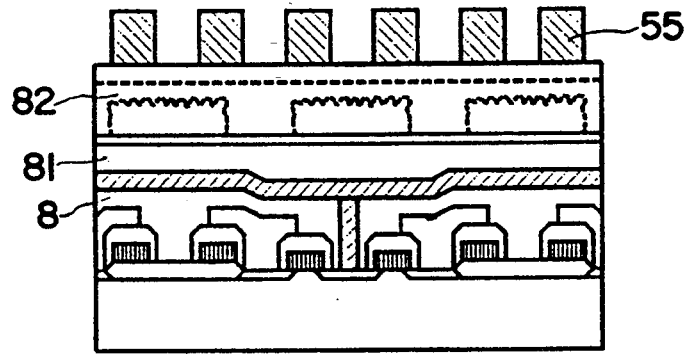
Figure 1E:
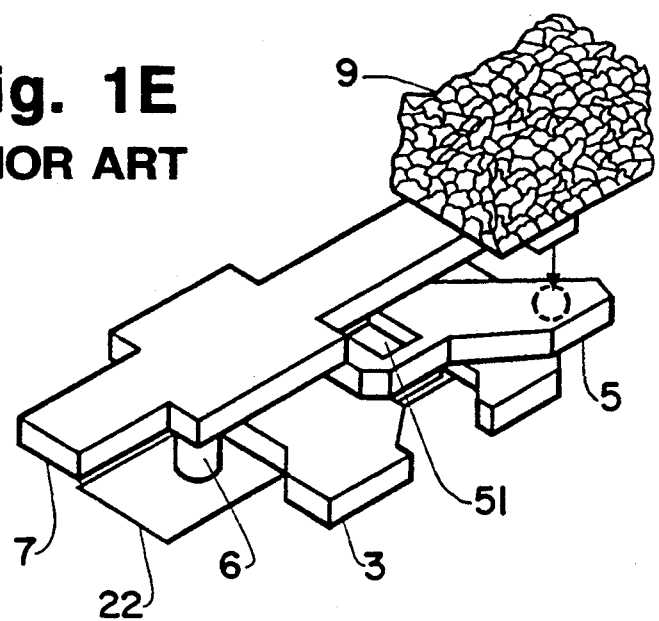
Figure 1F:
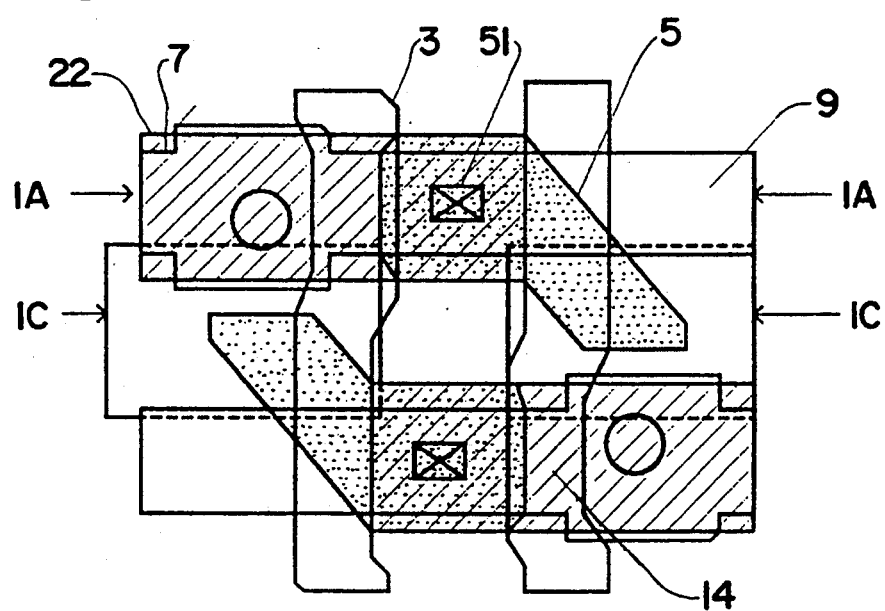
Figure 2A:
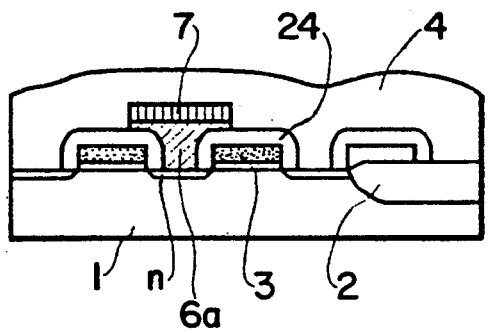
FIGS. 2A to 9 illustrate the process for formation of a memory cell in accordance with the present invention, its structure and its layout.
Figure 2B:
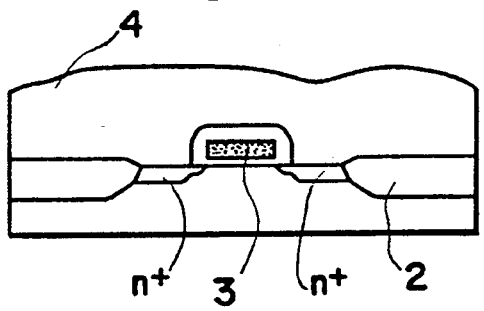
Figure 3A:
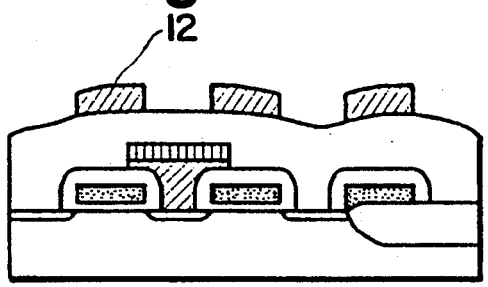
Figure 3B:
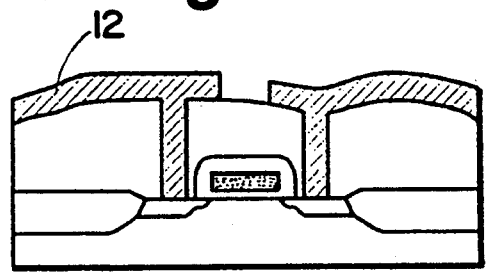
Figure 4A:
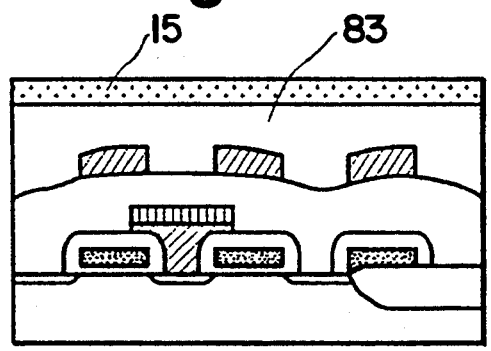
Figure 4B:
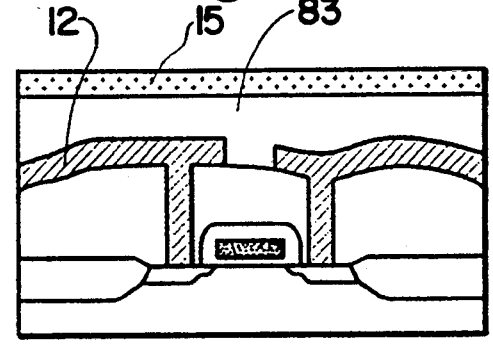
Figure 9:
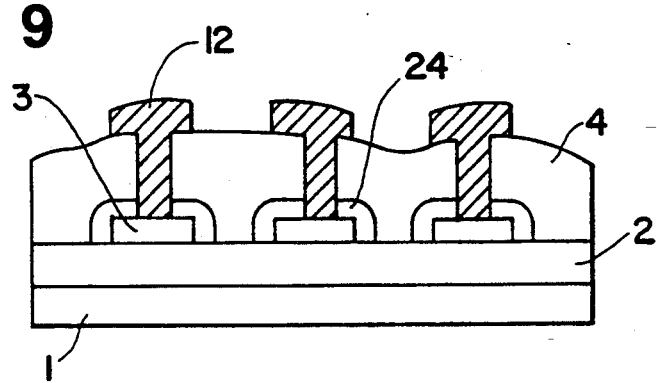

Then, as shown in FIG. 3, a contact is opened to a source/drain region of the active area and also to a word line (the contact to the word line is not shown in FIG. 3), which are to be connected to primary metallization wiring 12. Then, primary metallization wiring 12 is deposited and patterned. FIG. 9 illustrates a contact hole formed on word line 3, with primary metallization wiring 12 connected to word line 3 through this contact hole. As shown in FIG. 3B, primary metallization wiring 12 may be connected to source/drain regions of a transistor.

The primary metallization wiring is formed using a refractory metal having a melting point of over 800° C., such as tungsten (W), or a refractory metal compound such as TiSi$_2$, so that the metal maintains stability under the heat treatment applied during formation of the capacitor.

Then, as shown in FIG. 4, a single or multi oxide layer 83 is deposited and flattened, and insulating layer 15 (which may be a silicon nitride layer, Si$_3$N$_4$) having a high etch selectivity (i.e., a large difference in etch rate from the single or multi oxide layer) is deposited.

Figure 5A:
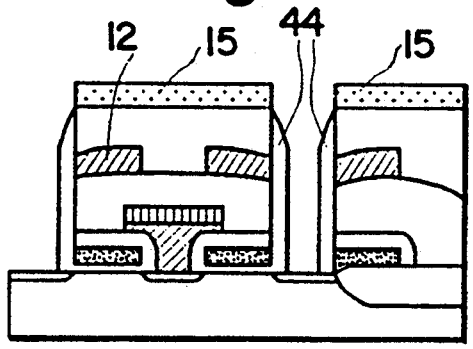
Figure 5B:
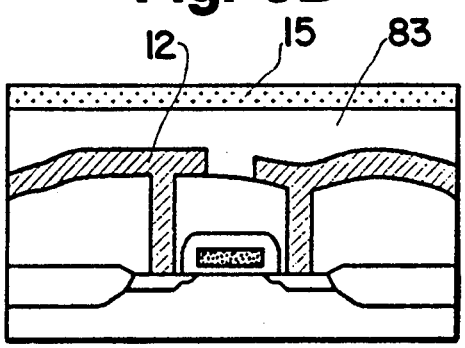

Then, as shown in FIG. 5, after a contact hole for connection to the storage electrode is opened to the drain region of the active area, an oxide layer is deposited and an anisotropic dry etching is carried out to a depth greater than the thickness of the oxide layer, so that oxide side wall 44 beside the contact hole is formed below insulating layer 15 as illustrated in FIG. 5.

Then, as shown in FIG. 6, a polysilicon layer is deposited upon the wafer and patterned to form storage electrode 9a. Then, insulating layer 15 (which, again, may be a silicon nitride layer) is removed by carrying out a wet etching process, and, then, capacitor dielectric layer 10 is formed on the surface of capacitor storage electrode 9a. Contact hole 16 is opened to primary metallization wiring 12 for capacitor plate 11 to be connected to the transistor (see FIG. 6B) by carrying out a photo etching process on dielectric layer 10 and oxide layer 83.

Then, as shown in FIG. 7, a polysilicon layer is deposited and patterned to form capacitor plate electrode 11. During this process, a contact between capacitor plate electrode 11 and primary metallization wiring 12 is simultaneously formed in a self-aligned manner. After insulating layer 84 is deposited, a secondary metallization material is deposited and patterned to form secondary metallization wiring 17.

During the formation of the storage capacitor, since the capacitor is disposed between primary metallization wiring 12 (lying over bit line 7) and final metallization wiring 17, the material for the metallization wiring except for the final metallization wiring has a melting point higher than the capacitor formation temperature, and the polysilicon used in the present invention is doped polysilicon.

The layout of the stacked capacitor cell which is manufactured by applying the above described process is shown in FIG. 8.

According to the present invention as described above, the effective area of the capacitor can be increased by utilizing the height difference of the buried contact. Further, since the capacitor electrode is formed after formation of the primary metallization wiring, the height difference between the memory cell and the surrounding circuit portions can be decreased, with the result that the precision for all the elements including the primary metallization wiring can be improved.

While a preferred embodiment of the present invention has been illustrated and described, it is anticipated that various changes and modifications will be apparent to those skilled in the art, and that such changes may be made without departing from the spirit and scope of the present invention as defined by the following claims:

What is claimed is:

1. A process for formation of a semiconductor memory cell, comprising:
   (1) depositing an insulating inter-layer after forming circuit elements including transistors and memory access transistors each having source/drain regions upon a silicon substrate, opening a bit line contact, depositing a doped polysilicon layer, etching back the doped polysilicon layer to form a polysilicon plug in the bit line contact, depositing a tungsten polycide, and patterning the tungsten polycide to form a bit line connected to the polysilicon plug;
   (2) depositing an insulating inter-layer and flattening the insulating inter-layer, opening a contact hole to a word line and a contact hole to a source/drain region of a transistor to be connected to a primary metallization wiring layer, depositing a refractory metal or metal compound, and patterning the refractory metal or metal compound to form the primary metallization wiring;

(3) depositing and flattening an oxide layer, and depositing an insulating layer having an etch selectivity higher than that of the oxide layer;

(4) opening a contact hole of a buried contact for connecting a source/drain region of one of the memory access transistors to a storage electrode of a storage capacitor, depositing an oxide layer thereupon, and etching the oxide layer to a depth greater than the thickness of the oxide layer in order to form a oxide side wall in the contact hole;

(5) depositing a polysilicon layer and patterning the polysilicon layer to form a storage electrode, removing the high etch selectivity insulating layer by wet etching, and forming a dielectric layer on the surface of the storage electrode of capacitor; and (6) depositing and patterning a plate polysilicon layer, depositing an insulating layer thereupon, and forming a secondary metallization wiring on the insulating layer.

2. The process for formation of a semiconductor memory cell as claimed in claim 1, wherein the material of the primary metallization wiring formed at step (2) is a refractory metal or metal compound having a melting point of over 800° C.

3. The process for formation of a semiconductor memory cell as claimed in claim 1, wherein in step (6) after opening the contact hole for connecting the primary metallization wiring to the plate electrode of the capacitor, a polysilicon layer is deposited and patterned in order to form a capacitor plate, wherein the primary metallization wiring and the plate electrode of the capacitor are contacted with each other in a self-aligned manner. A1 A reference herein to FIG. 1 (A), for example, generally is a reference also to FIG. 1 (A'), etc. A2 and also to a word line (the contact to the word line is not shown in FIG. 2 (B)), A3 As shown in FIG. 2 (B'), primary metallization wiring 12 may be connected to source/drain regions of a transistor.

4. A method for making a semiconductor device, comprising the steps of:
    forming an active region and a field region on a semiconductor substrate;
    forming a word line on the semiconductor substrate and first and second impurity regions on the sides of the word line in the active region;
    forming a first insulating layer on the semiconductor substrate;
    forming a first contact hole on the first impurity region;
    forming a bit line connecting the first impurity region through the first contact hole;
    forming a second insulating layer on the bit line and the first insulating layer;
    forming a second contact hole on the word line and forming a wiring layer connected to the word line through the second contact hole;
    forming a third insulating layer on the wiring layer and the second insulating layer;
    forming a third contact hole on the second impurity regions;
    forming a conductive layer on the third insulating layer and the third contact hole;
    forming a storage electrode on the third contact hole by a selective etch; and
    forming a dielectric layer and a plate electrode on the storage electrode.

5. The method of claim 4, wherein the wiring layer comprises tungsten and $TiSi_2$.

6. The method of claim 4, wherein the wiring layer comprises a metallic material having a melting point above about 800° C.

7. The method of claim 4, wherein the wiring layer comprises a refractory metal or metal compound having a melting point above about 800° C.

8. The method of claim 4, wherein the second insulating layer comprises silicon nitride.

9. The method of claim 4, wherein the plate electrode comprises polysilicon.

10. The method of claim 4, wherein the second insulating layer comprises BPSG or CVD oxide.

11. The method of claim 4, further comprising the steps of forming a fourth insulating layer and forming a second wiring layer on the fourth insulating layer.

12. The method of claim 4, wherein the third insulating layer comprises multiple insulating layers having different etch selectivities.

13. A method for making a semiconductor device, comprising the steps of:
    forming an active region and a field region on a semiconductor substrate;
    forming a word line on the semiconductor substrate and first and second impurity regions on the sides of the word line in the active region;
    forming a first insulation layer on the active region and the field region;
    forming a first contact hole on the first impurity region;
    forming a bit line connecting the first impurity region through the first contact hole;
    forming a second insulating layer on the bit line and the first insulating layer;
    forming a second contact hole on the word line and forming a wiring layer connected to the word line through the second contact hole;
    forming a third insulating layer and a fourth insulating layer on the wiring layer and the second insulation layer;
    opening a third contact hole on the second impurity region;
    forming an insulating side wall spacer along the inner sides of the third contact hole;
    forming a conductive layer on the fourth insulating layer and the third contact hole;
    forming a storage electrode over the third contact hole by patterning the conductive layer;
    wet etching the fourth insulating layer; and
    forming a dielectric layer and a plate electrode on the storage electrode.

14. The method of claim 13, wherein the third and fourth insulating layers have different etch rates.

15. The method of claim 13, wherein the fourth layer comprises silicon oxide.

16. The method of claim 13, wherein the insulating side wall spacer comprises silicon oxide.

17. The method of claim 13, wherein the insulating side wall spacer is formed by anisotropic etching of a silicon oxide layer.

18. The method of claim 13, wherein the bit line comprises tungsten polycide.

19. The method of claim 13, wherein the wiring layer comprises a metallic material having a melting point above about 800° C.

20. The method of claim 13, wherein the wiring layer comprises a refractory metal or metal compound having a melting point above about 800° C.

21. The method of claim 13, wherein the second insulating layer comprises BPSG or CVD oxide.

22. The method of claim 13, further comprising the steps of forming a fifth insulating layer and forming a second wiring layer on the fifth insulating layer.

* * * * *